United States Patent [19]

Abramson et al.

[11] Patent Number: 4,814,634
[45] Date of Patent: Mar. 21, 1989

[54] TERNARY SIGNAL MULTIPLEXOR CIRCUIT

[75] Inventors: Paul Abramson, Raleigh; David E. Conner, Cary; Lee C. Haas, Raleigh, all of N.C.

[73] Assignee: International Business Machines Corporation, Armonk, N.Y.

[21] Appl. No.: 100,061

[22] Filed: Sep. 23, 1987

[51] Int. Cl.⁴ .................... H03K 17/56; H04L 5/16
[52] U.S. Cl. ................... 307/243; 307/242; 375/36; 355/58; 328/104; 328/154
[58] Field of Search ............ 307/241, 242, 243, 296.3, 307/473; 328/104, 154; 375/7, 17, 36; 455/58; 340/825.5; 370/112

[56] References Cited

U.S. PATENT DOCUMENTS

| | | | |
|---|---|---|---|
| 2,889,537 | 10/1955 | Elliott | 307/243 |
| 3,453,495 | 7/1969 | Thomas | 317/26 |
| 3,832,494 | 8/1974 | Seim et al. | 179/15 BA |
| 3,842,401 | 10/1974 | Smith, Jr. et al. | 340/146 AB |
| 3,904,977 | 9/1975 | Barsotti | 330/51 |
| 3,974,397 | 9/1976 | Killough, Jr. | 307/82 |
| 4,010,385 | 3/1977 | Krol | 307/243 |
| 4,063,040 | 12/1977 | Fontanes et al. | 179/15 A |
| 4,087,642 | 5/1978 | Jessop et al. | 179/15 BM |
| 4,243,976 | 1/1981 | Warner et al. | 340/347 DD |
| 4,387,460 | 6/1983 | Boutmy et al. | 370/110.4 |
| 4,445,222 | 4/1984 | Smitt | 375/36 |
| 4,649,548 | 3/1987 | Crane | 455/58 |

OTHER PUBLICATIONS

Hippert et al., "Transmission line multiplexor", IBM Technical Disclosure Bulletin, vol. 14, No. 7, Dec. 1971, pp. 2110-2111.
Grimes, "Ternary CMOS Logic Device," IBM Technical Disclosure Bulletin, vol. 17, No. 4, Sep. 1974, pp. 1145-1146.

*Primary Examiner*—Stanley D. Miller
*Assistant Examiner*—Nancy Thai
*Attorney, Agent, or Firm*—John C. Smith; J. B. Frisone; M. H. Klitzman

[57] ABSTRACT

The multiplexing circuit disclosed herein combines multiple input signals into a common output by allowing ternary signals to pass from multiple input circuits to a common output circuit. The circuit combines ternary signals with minimum feedback between input circuits. The circuit is passive, has minimum attenuation, and a small number of components.

12 Claims, 4 Drawing Sheets

TERNARY SIGNAL MULTIPLEXOR CIRCUIT

BACKGROUND OF THE INVENTION

1. Technical Field

This invention relates to multiplexing a plurality of ternary input signals into a common output. More particularly, the invention relates to a ternary signal multiplexor circuit capable of passively multiplexing ternary input signals with minimum feedback and minimum attenuation.

2. Background Art

Multiplexors capable of combining multiple input signals into a common output signal are well known. Multiplexors are used in a variety of equipment, such as power supplies, telephonic equipment, and logic circuits. Some of the problems associated with prior art multiplexors are that: (1) they have poor isolation of input sources, (2) they attenuate the signal, (3) they need an external power source and (4) they are costly due to a requirement for numerous components. Due to the interaction of these problems in prior art multiplexors, solving any one of them has often resulted in exacerbating the others.

The following is a more detailed discussion of the problems identified above. With regard to attempts to improve isolation, they have often resulted in overly complex isolation circuits in each input stage of the multiplexor. There are several disadvantages associated with isolation stages. Not only do they require a significant number of components, but a separate power supply is often required to operate the isolation circuits. These disadvantages result in an increase in both operational and fabrication costs.

Attenuation in prior art multiplexors typically increases as the number of input signal lines are added. For example, a multiplexor with four input lines would produce an output signal with ¼ the energy of the input signal. Likewise, a multiplexor with eight input lines would produce an output signal with ⅛ the energy of the input signal. As the number of input signal lines increase, the amount of attenuation increases.

Further, the problem of attenuation has often been solved at the cost of adding complex amplifier stages and separate power supplies to the circuit. As a result, the same disadvantages associated with attempts to improve the isolation problem recur in circuits designed to minimize attenuation. Alternatively, minimizing the attenuation by reducing the complexity of the multiplexor often leads to inadequate isolation.

An external power source adds to the cost of the multiplexor, and can limit the physical location of circuits due to a necessity to have the power supply within a reasonable distance of the multiplexor. However, a passive multiplexor can have adverse effects on signal strength.

Utilizing a large number of components to allow for more options in the design of a circuit for isolation purposes results in increasing the circuit size, increasing the power requirements, increasing the attenuation caused by the components in the circuit, and increasing the cost of fabrication.

SUMMARY OF THE INVENTION

It is an object of this invention to multiplex multiple ternary signals into a single output signal in an improved manner.

It is another object of this invention to maximize isolation between input circuits.

It is a further object of this invention to minimize signal attenuation.

It is still another object of this invention to passively multiplex ternary signals.

It is still a further object of this invention to multiplex ternary signals with a signal multiplexor circuit having a small number of components.

These and other objects are accomplished by a circuit that has a plurality of ternary input signals and a single ternary output signal. Multiplexing is accomplished by using parallel oppositely poled transistor diode combinations in each input stage where each of the input stages use the output of other input stages to reverse bias the transistor diode combinations and provide a high impedance block in each of the separate signal paths between the ternary input of the input stage and the output of other input stages.

DESCRIPTION OF THE PREFERRED EMBODIMENT

Figure 1:
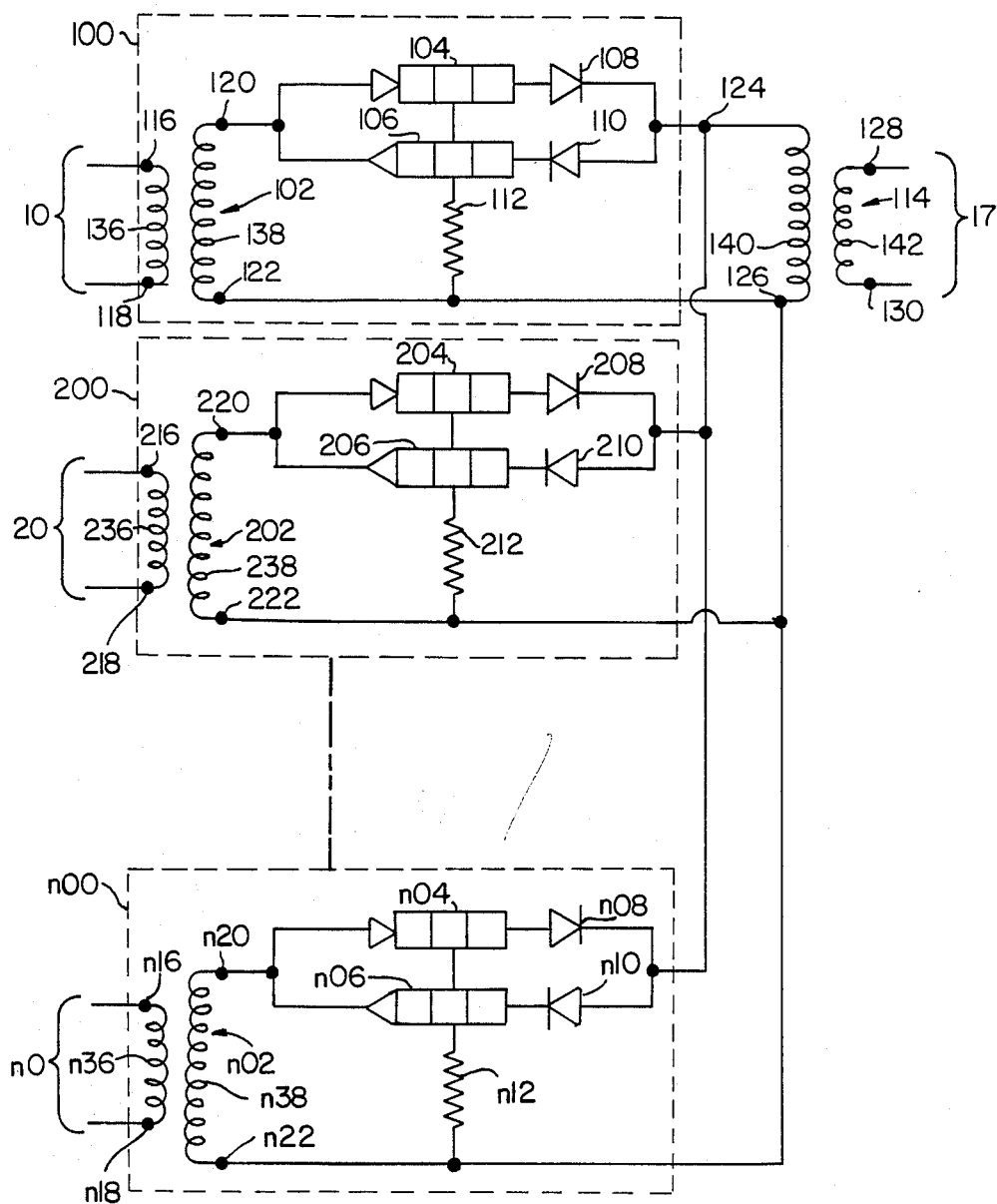
FIG. 1 shows a circuit capable of multiplexing ternary signals.
Figure 2A:
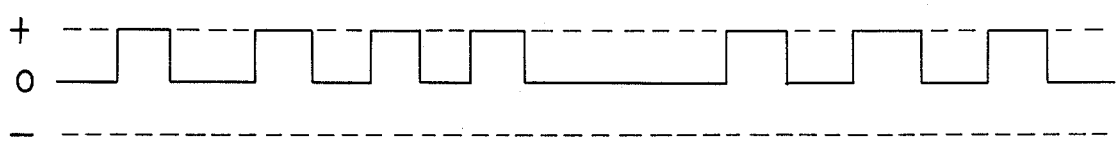
FIG. 2A-D shows ternary signals having zero, positive, and negative polarities.
Figure 2B:
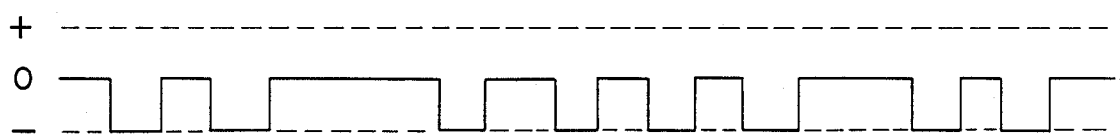
Figure 2C:
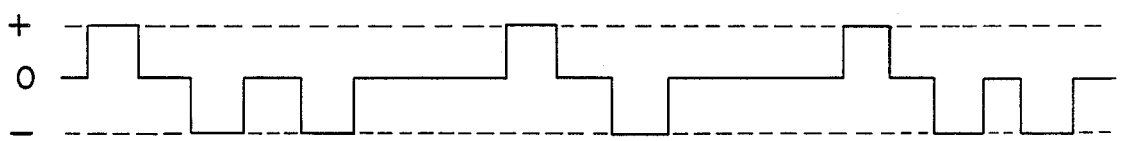
Figure 2D:
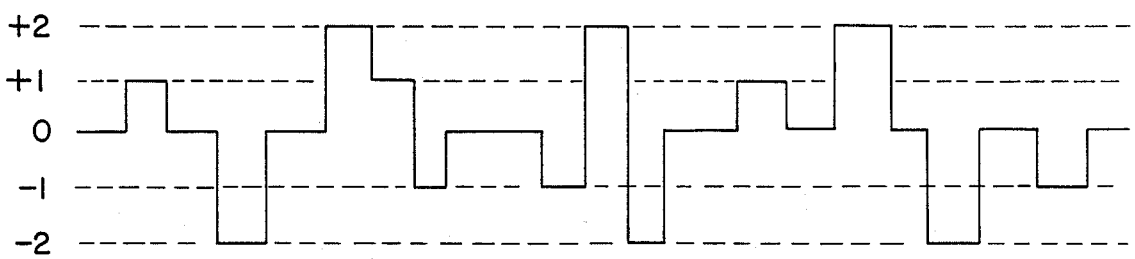

FIG. 1 is a schematic of the circuit and FIGS. 2A through 2D are diagrams of ternary input signals that could be used by the circuit in FIG. 1. For the purpose of this disclosure, a ternary signal is defined as a signal with positive, zero, and negative polarities. A ternary signal differs from a trinary signal in that a trinary signal is limited to a single polarity, either positive or negative, even though it uses three levels of that polarity. The circuit disclosed herein will work with ternary signals having multiple levels of each polarity. Likewise, it will work also with signals having a single positive or negative polarity. For ease of illustration, the ternary signal depicted by FIG. 2C will be used to describe the operation of the circuit. It will be understood by those skilled in the art that the single polarity signals depicted by FIGS. 2A and 2B, and the multiple level ternary signal depicted by FIG. 2D will also work with this circuit. A passive circuit is one which is powered by the input signals and does not require an external power source. Finally, the circuit disclosed herein is designed to multiplex one input signal at a time, and not to multiplex ternary signals simultaneously arriving at the input to the multiplexor.

In FIG. 1, input lines 10, 20, n0 are connected to the input sides of input stages 100, 200, n00 respectively through a transformer 102 having a primary winding 136 and a secondary winding 138. The output sides of input stages 100, 200, n00 are connected to a transformer 114 having a primary winding 140 and a secondary winding 142. The output of the input stages 100, 200, n00 are connected to a common output line 17 through transformer 114. Since each input stage 100, 200, n00 is identical to the other input stages 100, 200, n00, the circuit will be described in terms of input stage 100 with an understanding that the other input stages, 200, n00 operate in like fashion.

By way of general description, isolation of input line 10 from the output of other input stages 200, n00 is accomplished as follows. A ternary signal on input line 10 will pass through input stage 100 to output line 17. Signals from other input stages will be prevented from feeding back into input line 10 by isolation circuitry comprised of transistor-diode combination 104 and 108, parallel oppositely poled transistor-diode combination 106 and 110 and resistor 112 in the input stage. The circuitry allows ternary signals to pass in one direction only, from input line 10 to output line 17. Signals from the output of other input stages 200, n00 will be prevented from feeding back into input line 10 due to a high impedance block that is created by the isolation circuitry 104–112 in response to signals from other input stages 200, n00 as will hereinafter be more fully explained.

More specifically, isolation of input line 10 is provided by transistor-diode combination 104 and 108 that comprises part of signal path 102, 104, 108, 114 and oppositely poled transistor-diode combination 106 and 110 that comprises part of signal path 102, 106, 110, 114 of input stage 100, and by resistor 112 which is used to bias transistors 104 and 106. The transistor-diode combination 104, 108 and transistor-diode combination 106, 110 allow signals originating on input line 10 to pass through one of the combinations 104 and 108 or 106 and 110. The transistor-diode combination 104,,108 or 106, 110 is selected by the polarity of the input signal. The transistor-diode combination 104, 108 and transistor-diode combination 106, 110 are connected in parallel and configured such that while an input signal of a given polarity on input line 10 will cause one transistor-diode combination to conduct and the other oppositely poled transistor-diode combination connected in parallel to reverse bias, a signal of any polarity produced by another input stage 200, n00 will reverse bias both transistor-diode combinations in input stage 100, thereby creating a high impedance block in the current path of output winding 138 of input transformer 102. By preventing current flow in the output winding 138 of input transformer 102 of input stage 100, the high impedance block will prevent signals from input stages 200, n00 from feeding back into input line 10. A detailed description of how the high impedance block is created by signals from other stages 200, n00 will be explained in the operation section.

In a general context, minimum attenuation is desirable because as attenuation is minimized, the possibility of error due to attenuated signal strength is reduced. Further, an attenuated signal may require amplification at some point, thereby increasing cost of operation and device complexity. The attenuation of the multiplexor disclosed herein is limited to the fixed drop of voltage across the components of the input stage. There is no progressive loss Of signal energy as the number of input signal lines increase.

In addition, minimization of attenuation is further enhanced by a step-up ratio in the input transformer 102 and a step-down ratio in the common output stage which is comprised of transformer 114. More specifically, the step-up/step-down ratios will reduce the relative amount of signal loss due to the saturation drop across the components 104–110 of input stage 100. Since these drops are relatively fixed by the circuit components, a large signal will have a proportionately smaller drop than a small signal. A typical turns ratio may be on the order of 4:1, but can vary due to specific values of circuit components, signal strength, etc. Therefore, the turns ratio selected is a matter of routine circuit design choice, as are the values for all of the other circuit components. A detailed description of how transformers 102, 114 operate to reduce signal attenuation is in the operation section.

Each input stage 100, 200, n00 is completely passive, requiring no external power. The input signals power the circuit. Passive operation has several advantages. There is no requirement for a separate power supply, there is less complexity, there is more energy efficiency, and there is less expensive construction.

Input stages are attached to output transformer 114 at 124 and 126 as shown in FIG. 1. Signals passing through each of the plurality of input stages are processed in the same manner as the signal in input line 10, described above. Each input line 10, 20, n0 is connected to its own input stage 100, 200, n00, with its output connected in common to the output transformer 114. For ease of illustration, only 3 inputs 10, 20, n0 are shown in FIG. 1. It is recognized that any number of input stages could be used depending on the number of input signals.

Figure 3:
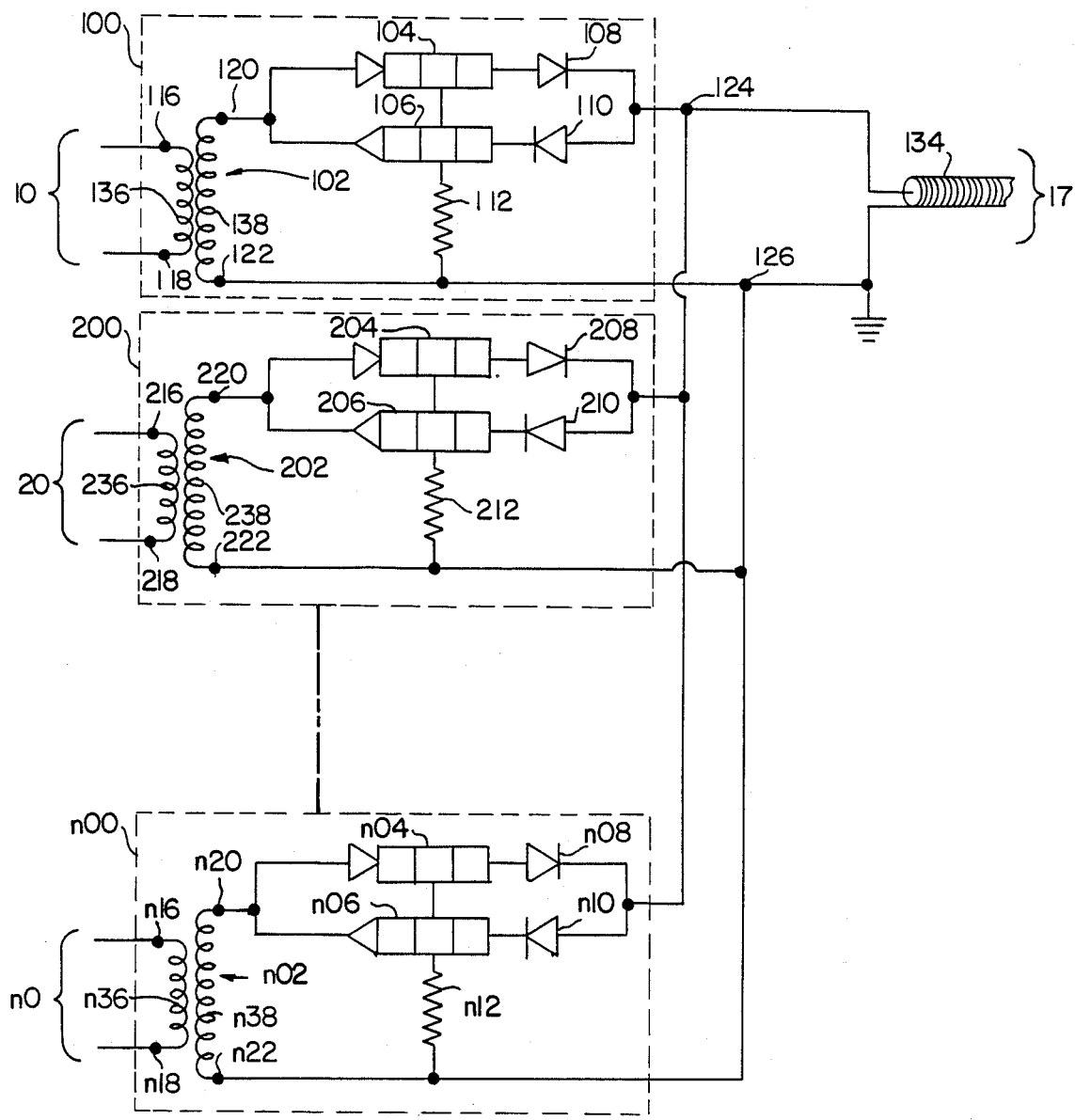
FIG. 3 shows an alternative embodiment of the invention, with a coaxial cable in lieu of an output step-down transformer.
Figure 4:
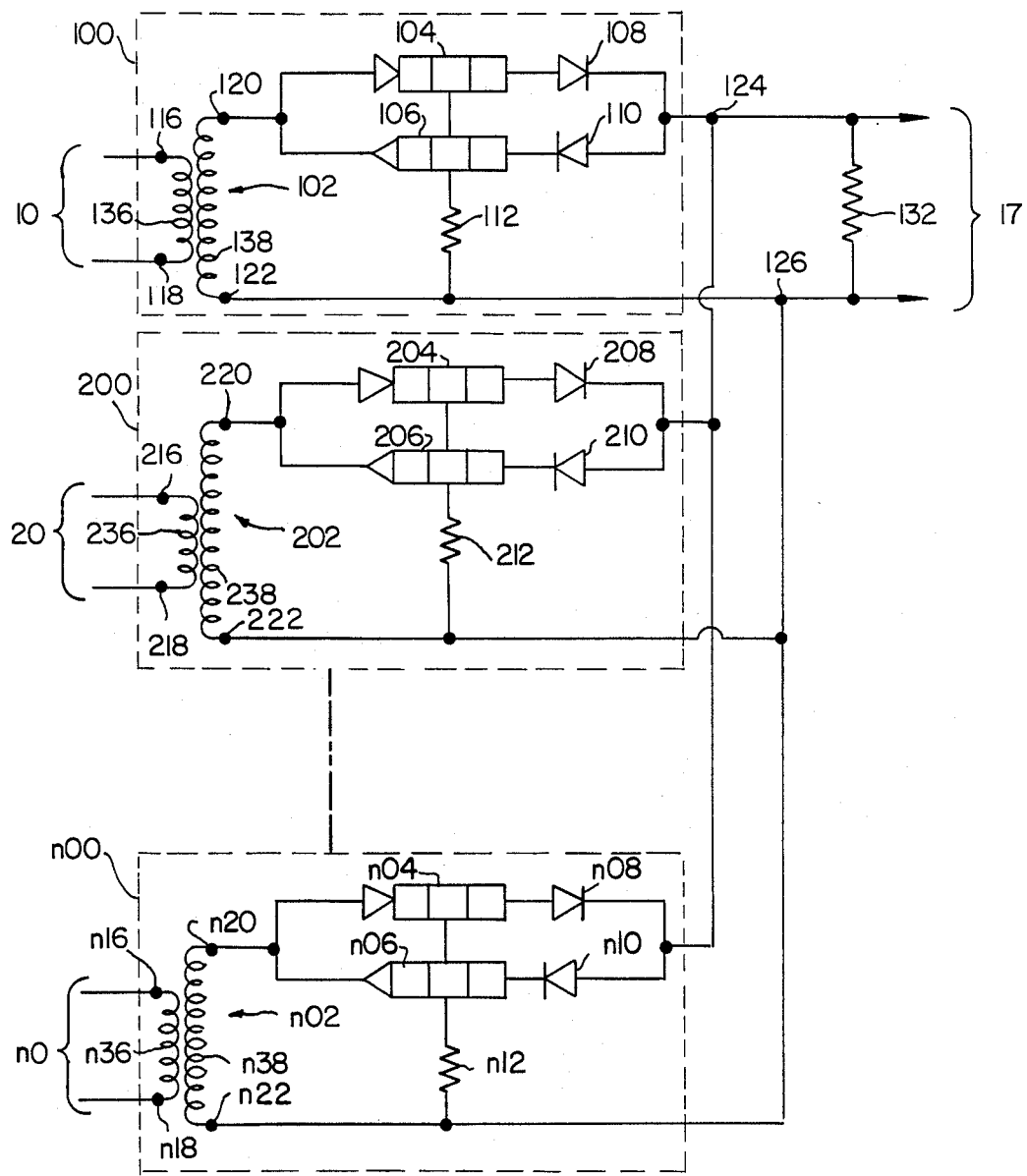
FIG. 4 shows another alternative embodiment of the invention. In this figure, a resistive output is used in lieu of an output step-down transformer.

The preferred embodiment uses lines which are balanced, both as to the inputs and the output. However, the alternative embodiments in FIGS. 3 and 4 are unbalanced lines which do not provide the output step-down transformer 114. In place of the output transformer 114, a coax 134 and a resistor 132 are shown. The advantages of the invention that provide high isolation of input lines, passive operation, and low fabrication costs remain in these embodiments, but the advantage of minimization of attenuation does not.

FIG. 3 shows an alternative embodiment of the invention. In FIG. 3, the output from each input stage 100, 200, n00, is connected directly to a coax cable 134. The circuit functions in the same manner as the circuit in FIG. 1 with one exception. Due to the absence of the output step-down transformer, the ability to alter signal levels by stepping-up and then stepping down the signal to reduce attenuation as described in the preferred embodiment is not present.

FIG. 4 shows another embodiment of the invention. In FIG. 4, the output from each input stage 100, 200, n00, is connected to a resistive output 132. As was the case with the embodiment described by FIG. 3, due to the absence of the output step-down transformer, the ability to alter signal levels to reduce attenuation as described in the preferred embodiment is not present.

OPERATIONS

The operation of the circuit shown in FIG. 1 is as follows. The manner in which positive, negative and zero polarity signals are processed by input stage 100 will be described in detail, as well as the effect of the output of other stages 200, n00 on input stage 100. The operation of the other stages 200, n00 is identical to the operation of input stage 100.

Input line 10 is connected to input stage 100. A ternary signal appearing on input line 10 is separated into positive and negative pulses. The pulses will pass through input stage 100 by way of separate paths depending on the polarity of the pulse. A positive pulse will pass through input stage 100 using the path 102, 104, 108 and 114. A negative pulse will pass through input stage 100 using path 102, 106, 110, 114. Pulses produced by other input stages 200, n00, and appearing at the output of input stage 100 will be prevented from feeding back into input line 10 by a high impedance block created by the transistor-diode combination 104, 108, and transistor-diode combination 106, 110 in input stage 100.

Ternary signals will pass from the input line 10 to the output line 17 as follows. A positive pulse on input line 10 will cause a positive pulse to appear between the output side 120 of input transformer 102 and the emitter of transistor 106, and a negative pulse to appear between the output side 122 of input transformer 102 and the collector of diode 110. The negative pulse from output side 122 of input transformer 102 will also be applied through resistor 112 to the base of transistor 106. Due to the positive pulse at the output 120 of input transformer 102 and the negative pulse at the base of transistor 106, transistor 106 will be reverse biased. Therefore, the transistor-diode combination 106, 110 will be prevented from passing the positive pulse on input line 10 through to output transformer 114.

A positive pulse on input line 10 will cause a positive pulse to appear between the output side 120 of input transformer 102 and the emitter of transistor 104, and a negative pulse to appear between the output side 122 of input transformer 102 and the emitter of diode 108, the negative pulse will also be applied through resistor 112 to the base of transistor 104. Due to the positive pulse at the output 120 of input transformer 102 and the negative pulse at the base of transistor 104, transistor 104 will be forward biased, thus allowing the pulse to pass through to diode 108. Diode 108 will be forward biased due to the positive pulse applied to its collector by transistor 104 and the negative pulse applied to its emitter by the output side 122 of input transformer 102. Therefore, the transistor-diode combination 104, 108 will be forward biased causing current to flow through the path 102, 114, 108, 104. The current flow through transformer 114 will cause the positive pulse to appear on output line 17.

A negative pulse on input line 10 will cause a negative pulse to appear between the output side 120 of input transformer 102 and the emitter of transistor 104, and a positive pulse to appear between the output side 122 of input transformer 102 and the emitter of diode 108. The positive pulse from output side 122 of input transformer 102 will also be applied through resistor 112 to the base of transistor 104. Due to the negative pulse at the output 120 of input transformer 102 and the positive pulse at the base of transistor 104, the transistor 104 will be reverse biased. Therefore, the transistor-diode combination 104, 108 will be prevented from passing the negative pulse on input line 10 through to output transformer 114.

A negative pulse on input line 10 will cause a negative pulse to appear between the output side 120 of input transformer 102 and the emitter of transistor 106, and a positive pulse to appear between the output side 122 of input transformer 102 and the collector of diode 110. The positive pulse from output side 122 of input transformer 102 will also be applied through resistor 112 to the base of transistor 106. Due to the negative pulse at the output 120 of input transformer 102 and the positive pulse at the base of transistor 106, the transistor 106 will be forward biased, thus allowing the pulse to pass through to diode 110. Diode 110 will be forward biased due to the negative pulse applied to its emitter by transistor 106 and the positive pulse applied to its collector by the output side 122 of input transformer 102. Therefore, the transistor-diode combination 106, 110 will be forward biased causing current to flow through the path 102, 114, 110, 106. The current flow through transformer 114 will cause the negative pulse to appear on output line 17.

Isolation of input stage 100 is achieved as follows. A positive pulse from another input stage 200, n00 will produce a positive pulse on the input side 124 of output transformer 114 and a negative pulse on the input side 126 of output transformer 114. The positive pulse on the input side 124 of output transformer 114 will apply to the emitter of diode 108. Diode 108 will be reverse biased by the positive pulse, thereby preventing conduction through transistor-diode combination 104, 108. The negative pulse on the input side 126 of output transformer 114 will apply a negative pulse through resistor 112 to the base of transistor 106. Transistor 106 will be reverse biased by the negative pulse, thereby preventing conduction through transistor-diode combination 106, 110. Since both transistor-diode combinations, 104, 108, 106, 110, are reversed biased, a high impedance block is placed in the current path of the output winding 138 of input transformer 102, thereby preventing feedback into input line 10 of a positive pulse from another input stage 200, n00.

A negative pulse from another input stage 200, n00 will produce a negative pulse on the input side 124 of output transformer 114 and a positive pulse on the input side 126 of output transformer 114. The negative pulse on the input side 124 of output transformer 114 will apply to the collector of diode 110. Diode 110 will be reverse biased by the negative pulse, thereby preventing conduction through transistor-diode combination 106, 110. The positive pulse on the input side 126 of output transformer 114 will apply a positive pulse through resistor 112 to the base of transistor 104. Transistor 104 will be reverse biased by the positive pulse, thereby preventing conduction through transistor-diode combination 104, 108. Since both transistor-diode combinations, 104, 108, 106, 110, are reversed biased, a high impedance block is placed in the current path of the output winding 138 of input transformer 102, thereby preventing feedback into input line 10 of a negative pulse from another input stage 200, n00.

Minimization of signal attenuation is accomplished as follows. Signal attenuation is due to the voltage drop across the transistors 104, 106 and the diodes 108, 110, through which the signal must pass. Since these drops are relatively fixed by the circuit components, a large signal will have a proportionately smaller drop than a small signal. The input and output transformers 102, 114 are reciprocal in turns ratio and impedance ratio so that the transformers 102, 114 are substantially transparent to the line. The input transformer 102 has a step-up ratio to increase the voltage level of the input signal and output transformer 114 has a step-down ratio to restore the signal voltage to level existing on input line 10.

The higher level signal that results from the step-up ratio will produce the same voltage drop across the components 104–112 of input stage 100 as the signal would at its original level prior to being stepped-up by input transformer 102. The output transformer 114 has a step-down ratio equal to the step-up ratio of input transformer 102. The result of temporarily stepping up the signal while it passes through the multiplexor is to reduce the amount of signal loss due to attenuation. The following example can be used to illustrate the effect of the step-up/step-down ratios on signal attenuation. The values used for signal levels were chosen for ease of illustration.

Assume that a 4 volt input signal is applied to input stage 100 from input line 10. Further assume that input transformer 102 has a 1:1 ratio (no step-up), output transformer 114 also has a 1:1 ratio (no step-down), and the components 104–112 of input stage 100 create a 1 volt drop in signal level. A 4 volt signal applied to the input winding 136 of input transformer 102 would produce a 4 volt signal at the output winding 138 of input transformer 102. A signal drop of 1 volt due to the characteristics of the components 104–112 of input stage 100 would result in the application of a signal level of 3 volts to the input winding 140 of output transformer 114. Therefore, the signal at the output winding 142 of output transformer 114 would be 3 volts.

If, on the other hand, a 1:4 step-up ratio was used by input transformer 102, and a 4:1 step-down ratio was used by output transformer 114, the output signal level would be as follows. An input signal of 4 volts applied to the input winding 136 of input transformer 102 would produce a 16 volt signal at the output winding 138 of input transformer 102. A loss of 1 volt in signal level due to voltage drop across the components 104–112 of input stage 100 would result in application of a 15 volt signal level to the input winding 140 of output transformer 114. The 4:1 step-down ratio of output transformer 114 would result in a signal level of 3.75 volts at the output winding 142 of output transformer 114, thereby significantly reducing the effects of attenuation due to circuit components.

Input stage 100 is completely passive, requiring no external power supply. The power required to pass the input signal on input line 10 through input stage 100 to output transformer 114 is provided solely by the input signal on line 10.

The circuit multiplexes the plurality of input ternary signals while simultaneously achieving a high level of isolation of input lines, minimizing attenuation of the signal, eliminating the need for an external power supply through passive operation, and reducing fabrication costs by being constructed with a small number of components.

While the invention has been described with respect to a preferred embodiment thereof, it will be understood by those skilled in the art that various changes in detail may be made therein without departing from the spirit, scope, and teaching of the invention. For example, the two alternative embodiments show changes that may be made to the circuit while retaining the primary advantages provided by the invention. Accordingly, the invention herein disclosed is to be limited only as specified in the following claims.

We claim:

1. A multiple input ternary signal multiplexor circuit, comprising:
   an input stage for a plurality of ternary input signals, said input stage having an input end and an output end;
   a common ternary output stage connected to the output end of each of said input stages;
   each of said input stages connected to a ternary signal input at said input end and each of said input stages connected to the common ternary output stage at said output end;
   each of said input stages having a positive polarity signal path for the positive polarity component of a ternary input signal, and a negative polarity signal path for the negative polarity component of a ternary input signal, each of said signal paths including a transistor-diode combination;
   each said transistor-diode combination including a transistor and a diode connected in series such that current can flow through said transistor-diode combination in one direction only;
   said transistor-diode combination for said positive polarity signal path and said transistor-diode combination for said negative polarity signal path connected in parallel;
   said positive polarity signal path having a current flow opposite in direction from the current flow of said negative polarity signal path;
   said transistor of said transistor-diode combination connected to the input end of said input stage and said diode of said transistor-diode combination connected to the output end of said input stage;
   said input stages connected in parallel at their output ends to the input end of said output stage;
   each of said input stages using said ternary input signals placed on the output end of said input stage by other input stages to reverse bias the transistor-diode combinations of said input stage, thereby providing a high impedance block in each of the separate signal paths between the ternary input of said input stage and the output of other input stages.

2. The circuit of claim 1, wherein the circuit is powered by said ternary input signal.

3. The circuit of claim 1, wherein the attenuation of the signal is substantially uneffected by the number of input stages.

4. The circuit of claim 1, further comprising means to reduce signal attenuation, comprising:
   means connected to the input end of each said input stage to increase the initial level of said ternary input signal upon entry into said input stage; and
   means connected to the output of said input stage to restore the level of said ternary input signal after exit from each of said input stages to the level of said ternary input signal prior to its entry into said input stage.

5. The circuit of claim 1, wherein each of said input stages further comprises an input transformer having an input side and an output side, said output side having a first and second end;
   said input transformer connected to a ternary input signal source at its input side; and
   said first end of said output side of said input transformer connected to the transistor-diode combination;
   said second end of said output side of said input transformer connected to the input of said output stage.

6. The circuit of claim 5, wherein the circuit is powered by said ternary input signal.

7. The circuit of claim 5, wherein the attenuation of said ternary input signal is substantially uneffected by the number of input stages.

8. The circuit of claim 5, further comprising means to reduce signal attenuation, wherein:
   said input transformers increase the level of said ternary input signals upon entry of said ternary input signals into each of said input stages; and
   said output stage is comprised of an output transformer to restore the level of said ternary input signals after said ternary input signals exit from each of said input stages.

9. A circuit for combining multiple ternary input signals into a common output signal with minimum feedback, comprising:

a plurality of input stages, each comprising a ternary signal source, an input transformer, two transistor-diode combinations connected in parallel, and a resistor;

a common output means;

one of said transistor-diode combinations conducting current in one direction with the other of said transistor-diode combinations capable of conducting current in the opposite direction, said combinations having the diode of each respective combination connected at one end of the parallel combination, and said transistor connected at the other end of the parallel combination, said transistor base in one transistor-diode combination connected to the base of the other transistor in the parallel transistor-diode combination;

said transistor-diode combinations having the transistor end of each combination attached to one side of said input transformer, and the diode and attached to one side of said common output means;

said input transformer connected on one side to the transistor end of a transistor diode combination, the other side of said input transformer attached to said resistor and to the common output means;

said resistor connected on one side to the bases of the transistors in the parallel transistor-diode combinations, and on the other side to said input transformer and to said common output means;

said ternary signal source providing a ternary signal to forward bias one transistor-diode combination in said parallel transistor-diode combinations;

said ternary signal source providing a ternary signal to reverse bias the transistor-diode combinations in all other input stages;

said common output means connected on one side of its input to the diode side of the transistor-diode combinations in each of the plurality of said input stages, and on the other side of its input to each of the plurality of said input transformers in each of said input stages and to each of the plurality of said resistors in each of said input stages.

10. The circuit of claim 9, wherein the circuit is powered by said ternary input signal.

11. The circuit of claim 9, wherein the attenuation of said ternary input signal is substantially uneffected by the number of input stages.

12. The circuit of claim 9, including means to minimize signal attenuation due to saturation drop in each of the plurality of input stages, comprising:

a step-up ratio in each of said input transformers to increase ternary signal levels upon entry into the input stages;

a common output means including an output transformer wherein the transformer has a step-down ratio to restore ternary signal levels to their initial levels.

* * * * *